(12) United States Patent
Söderbårg

(10) Patent No.: US 6,492,671 B2
(45) Date of Patent: Dec. 10, 2002

(54) CMOS PROCESS

(75) Inventor: Anders Söderbårg, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/818,710

(22) Filed: Mar. 28, 2001

(65) Prior Publication Data

US 2001/0014497 A1 Aug. 16, 2001

Related U.S. Application Data

(62) Division of application No. 09/549,948, filed on Apr. 14, 2000.

(30) Foreign Application Priority Data

Apr. 15, 1999 (SE) ................................................ 9901345

(51) Int. Cl.[7] ................................................ H01L 29/72
(52) U.S. Cl. ........................ 257/288; 257/369; 257/391; 257/392; 257/402
(58) Field of Search ................................ 257/288, 369, 257/391, 392, 402

(56) References Cited

U.S. PATENT DOCUMENTS 4,628,341 A * 12/1986 Thomas ........................ 257/288
4,701,796 A * 10/1987 Kamiya ........................ 257/288

OTHER PUBLICATIONS

S. Wolf, "Silicon Processing for the VLSI Era, vol. 2 – Process Integration", ISBN 0-961672-4-5, Lattice Press California 1990, pp. 17–44.

* cited by examiner

Primary Examiner—Edward Wojciechowicz
(74) Attorney, Agent, or Firm—Burns, Doane, Swecker & Mathis, L.L.P.

(57) ABSTRACT

A high-voltage MOS transistor is produced in a low-voltage CMOS process without adding extra process steps for producing the high-voltage MOS For. The high-voltage MOS transistor is to be used as an analog line driver and is produced on tho same silicon area as low voltage AD/DA-converters. Hereby, the low-voltage and the high-voltage design block are directly compatible with each other, e.g. have the same threshold voltages, which simplifies the design of the total solution.

7 Claims, 5 Drawing Sheets

CMOS PROCESS

This application is a continuation divisional of application Ser. No. 09/549,948, filed on Apr. 14, 2000.

TECHNICAL FIELD

The invention relates generally to a CMOS process and more specifically to a method of producing a high-voltage MOS transistor in a CMOS process.

BACKGROUND OF THE INVENTION

In ADSL (Asymmetric Digital Subscriber Line) systems, data are transferred at high speed from a central office to subscribers on existing telephone lines.

In the central office, there is a separate ADSL line card having an analog front end comprising e.g. high-speed AD/DA converters, line drivers and receivers.

To achieve required performance concerning speed and signal-to-noise ratio, the line driver has to work with a supply voltage above 10V. At the same time, modern mixed signal technologies, using submicron channel length, have to be used for the AD/DA part. Such technologies can normally not operate above 5V. Therefore, the line driver is implemented on a separate chip using bipolar technology, while the remaining part of the analog front end is implemented in an ordinary CMOS technology suited for modem AD/DA-design.

If extra process steps were added to the standard CMOS process, it would of course be possible to include the line driver on the same chip as the rest of Me analog front end, but such a process would be more complicated and more expensive compared to the standard technology. It could e.g. be done using a BiCMOS process, i.e. a process including both bipolar and CMOS transistors, where the bipolar pan is optimized for the line driver. However, as mentioned above, such a process is more expensive and complicated compared to a single CMOS process.

It could also be implemented using a dual gate CMOS process, which includes CMOS devices with two different gate oxides. A thicker gate oxide will then be able to handle the higher voltage. Such a process will of course also be more complicated Furthermore, it will be hard to obtain the necessary performances for ADSL using such types of MOS devices because a thicker gate oxide decreases the performance at high frequency.

A further way would be to add an LDMOS device to the process, where the channel length and the threshold voltage are set by adding an extra p-doped region inside the n-well. Extra process steps are then needed and the low-voltage devices and the high-voltage device will get different threshold voltages.

BRIEF DESCRIPTION OF THE INVENTION

The object of the invention is to implement all necessary functions for the analog front end on the same chip, i.e. including also the line drivers, by using an ordinary CMOS process flow suited for low voltage mixed signal design.

This is attained in that the design of the MOS transistor is modified in such a way that the process includes high-voltage MOS transistors with similar frequency performance and with the same threshold voltage as the low voltage n-channel MOS transistor. The high voltage MOS transistor is added without any extra mask steps or other steps to the process flow. Instead, the voltage is distributed inside an extended field region consisting of the same n-well dopants as is formed for the low-voltage PMOS transistor.

Hereby, in the same CMOS process, a high-voltage MOS transistor will be produced together with a low-voltage NMOS transistor and a low-voltage PMOS transistor on the same substrate. Further, the supply voltage for the low-voltage transistors can then be decreased without changing the breakdown voltage capability for the high voltage transistor.

BRIEF DESCRIPTION OF THE DRAWING

The invention will be described more in detail with reference to the appended drawing on which

DESCRIPTION OF THE INVENTION

Figure 1:
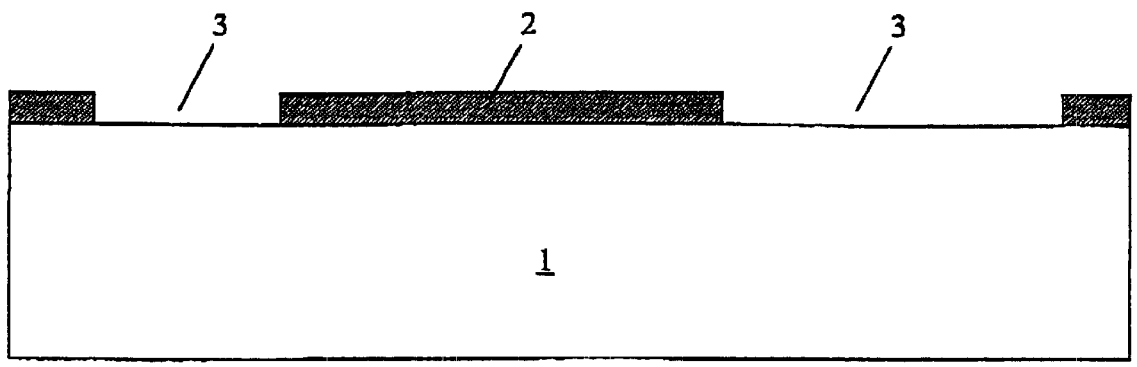
FIGS. 1–12 illustrate different steps in a CMOS process according to the invention.

FIG. 1 is a cross-sectional view of a substrate 1 e.g. a p-type substrate or a p-type silicon layer on a silicon substrate differently doped, with a mask 2 of an oxide, e.g. $SiO_2$, with openings 3 defining where n-well regions are to be located in the substrate for a high-voltage MOS transistor (to the right in FIG. 1) and a low-voltage PMOS transistor (to the left in FIG. 1).

Figure 2:
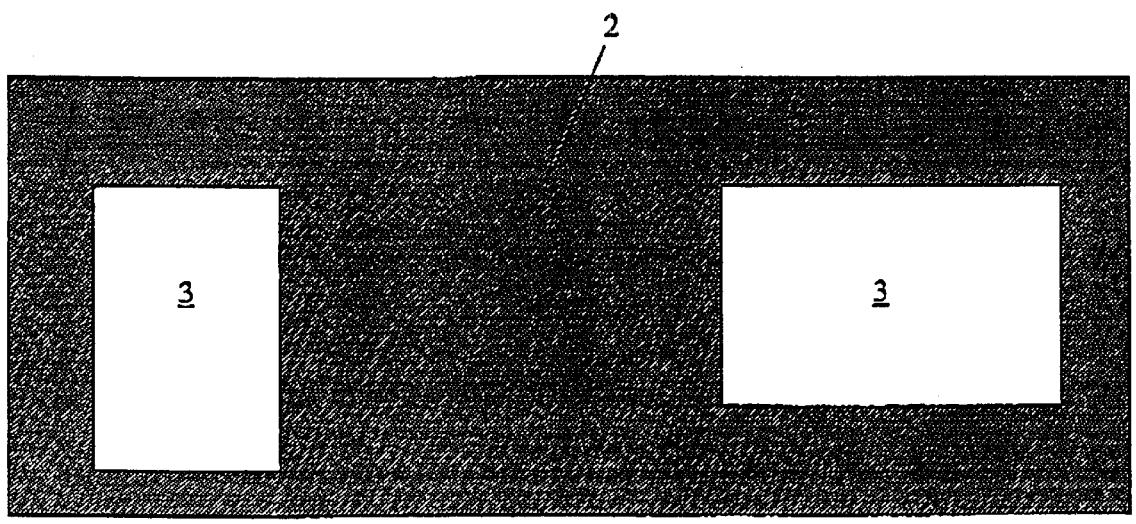

FIG. 2 is a top-view of the substrate with the mask 2 and the openings 3 illustrated in FIG. 1.

Figure 3:
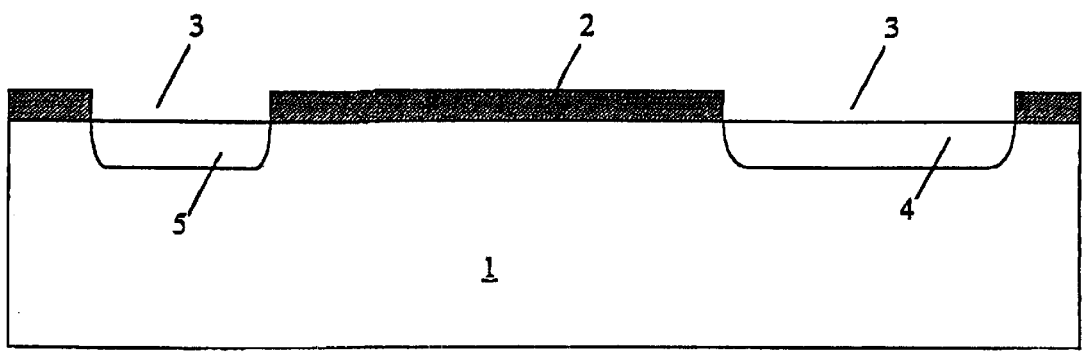

FIG. 3 is a cross-sectional view of the substrate 1 with the mask 2 with the openings 3 after that n-well regions 4 and 5 have been produced for the high-voltage MOS transistor and the low-voltage PMOS transistor, respectively.

The n-wells 4 and 5 are produced by doping die substrate hugh the openings 3 in the mask 2. The doping can e.g. be done by means of ion implantation of phosphorus.

In a CMOS process, the n-well regions are the regions where PMOS transistors are defined.

In accordance with the invention, the same implantation and masking sequences are used to create the drain region and the region tat is to distribute the voltage potential for the high-voltage transistor.

In a step not illustrated, the mask 2 is removed from the substrate 1 and a protective film of e.g. silicon nitride ($Si_3N_4$) is deposited on the substrate.

Figure 4:
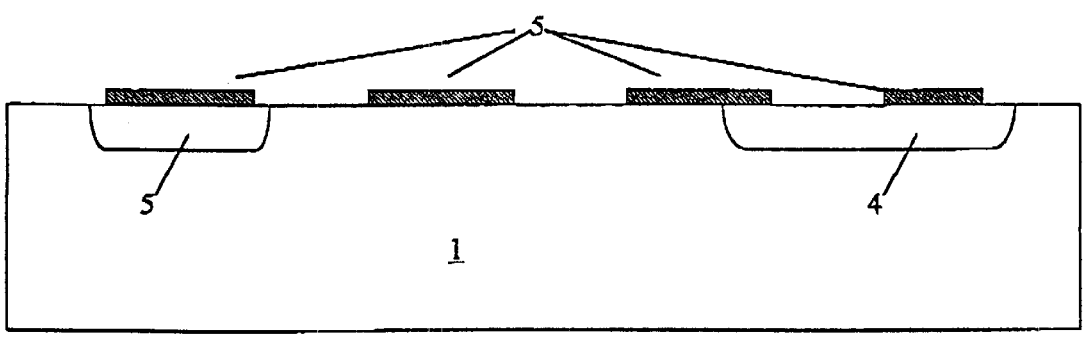

FIG. 4 is a cross-sectional view of the substrate 1 after that portions of the protective film have been removed.

The remaining portions 6 of the protective film are located where source, gate and drain regions for both the high-voltage MOS transistor and the low-voltage NMOS and PMOS transistors are to be defined. The low-voltage NMOS transistor is to be located between the high-voltage MOS transistor and the low-voltage PMOS transistor.

Figure 5:
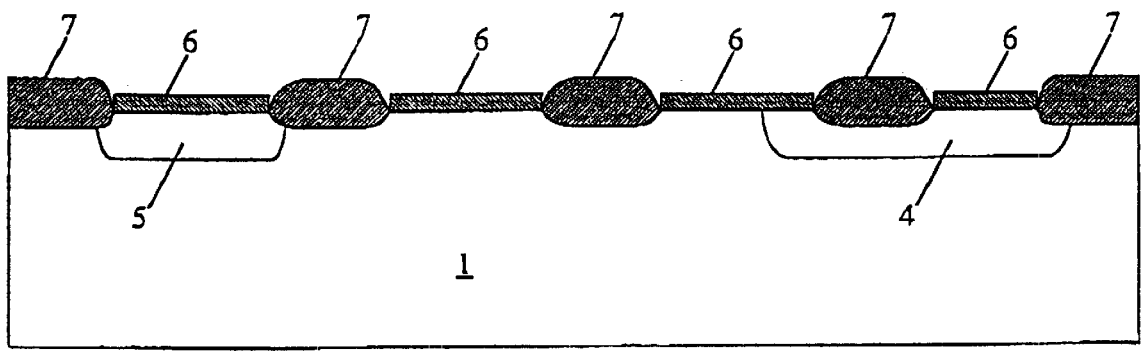

Next, the substrate 1 is exposed to an oxidizing atmosphere to produce an oxide on areas not covered by the protective film 6. In FIG. 5, these oxide regions are denoted 7.

This method of creating an oxide pattern on a silicon substrate is known and called LOCOS (LOCal Oxidation of Silicon). LOCOS oxidation is described i.a. in S. Wolf, "Silicon Processing for the VLSI Era, Volume 2—Process Integration", ISBN 0-961672-4-5, Lattice Press California 1990, pp. 17–44. LOCOS technique is regularly used in almost all CMOS processes to laterally separate the transistors from each other. This technique is normally used to create active regions, i.e. the regions where transistors are to be located.

In accordance with the invention, this step also defines part of the voltage distributing region for the transistor. The thickness of the oxide is normally between 4000 and 15000 A.U.

Figure 6:
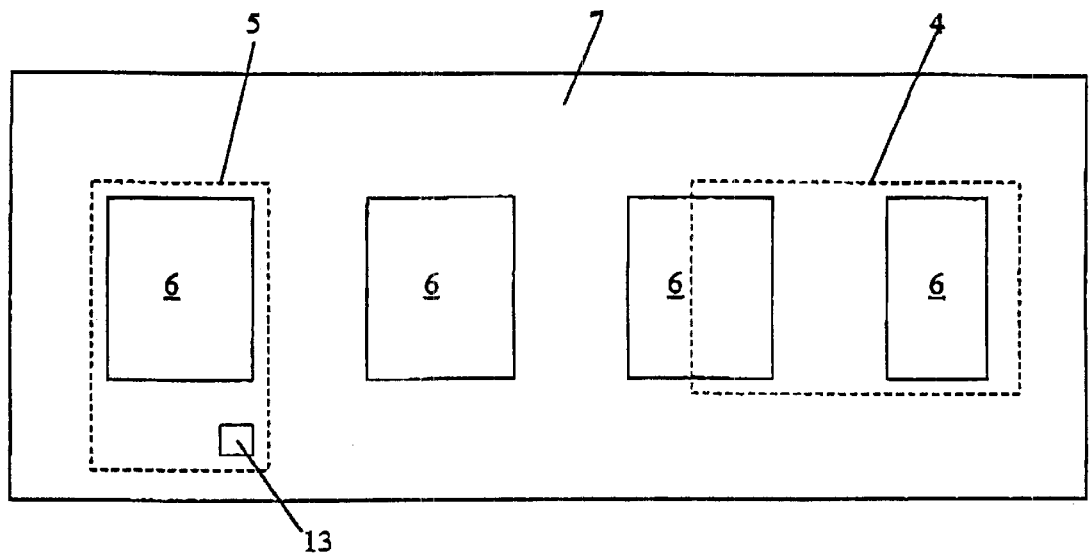

FIG. 6 is a top-view of the substrate 1 after it has been oxidized, i.e. the same step as illustrated in FIG. 5. The little square 13 to the left indicates where a contact to the n-well 5 is to be defined.

Figure 7:
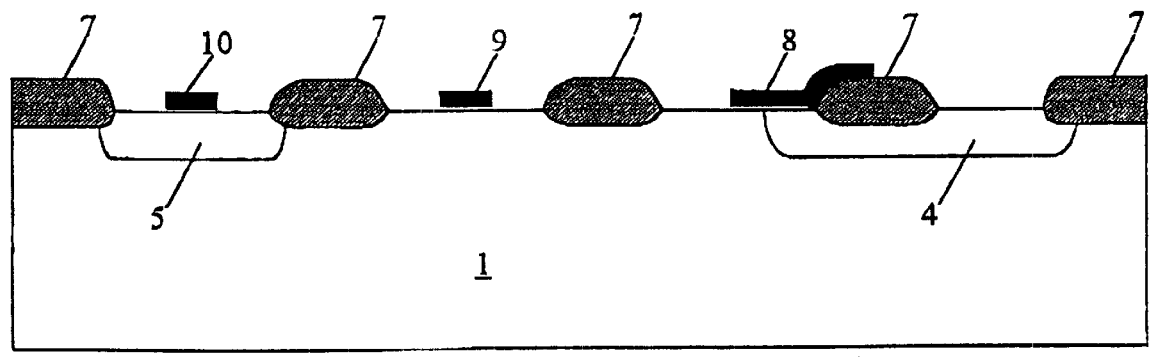

FIG. 7 illustrates the step where gate-regions 8, 9 and 10 have been defined for the high-voltage MOS transistor, the low-voltage NMOS transistor and the low-voltage PMOS transistor, respectively, To define the gate regions, the portions 6 of the protective film as illustrated in FIG. 5, have been removed, and a thin gate oxide (not shown) has been produced on the substrate 1. On the gate oxide (not shown), a layer of polycrystalline silicon (poly-Si) has been deposited and patterned to define the gate regions 8, 9 and 10.

As apparent from FIG. 7, the gate region 8 for the high-voltage MOS transistor extends partly on the oxide 7 above the n-well 4.

A normal thickness for the poly-Si layer is between 200 and 600 nm.

In accordance with the invention, the same gate structure, i.e. gate material and underlying gate oxide, that is used for the low-voltage PMOS transistor is used also for the high-voltage MOS transistor. Further, the doping concentration within the region where the channel for the high-voltage MOS transistor is to be located, looks identical to the channel region for the low-voltage NMOS transistor. Thereby, the high voltage MOS transistor will also have the same threshold voltage as the low voltage NMOS transistor.

Figure 8:
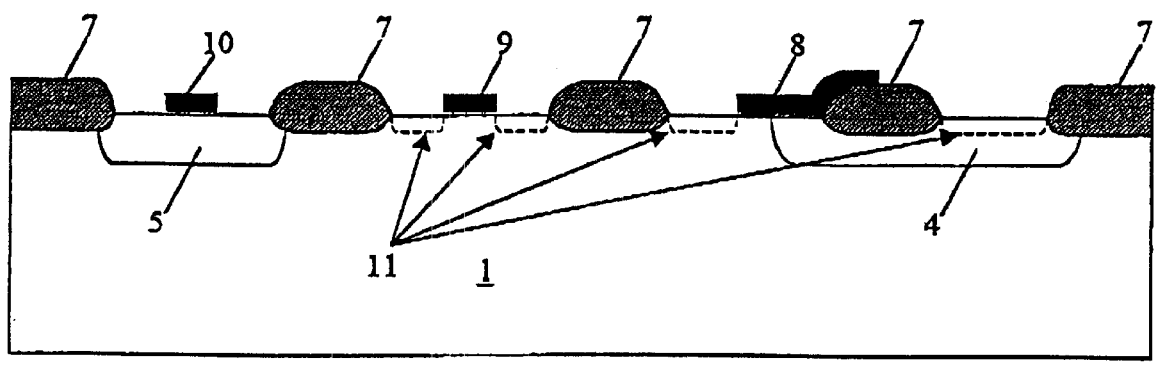

The next step is illustrated in FIG. 8. In this step, n+-regions 11 are defined, i.e. the regions that define the regions corresponding to drain and source for the low-voltage NMOS transistor and the contact to the n-well (not illustrated in the cross-sectional view). The same process step is also used to define source and drain for the high-voltage MOS transistor.

Figure 9:
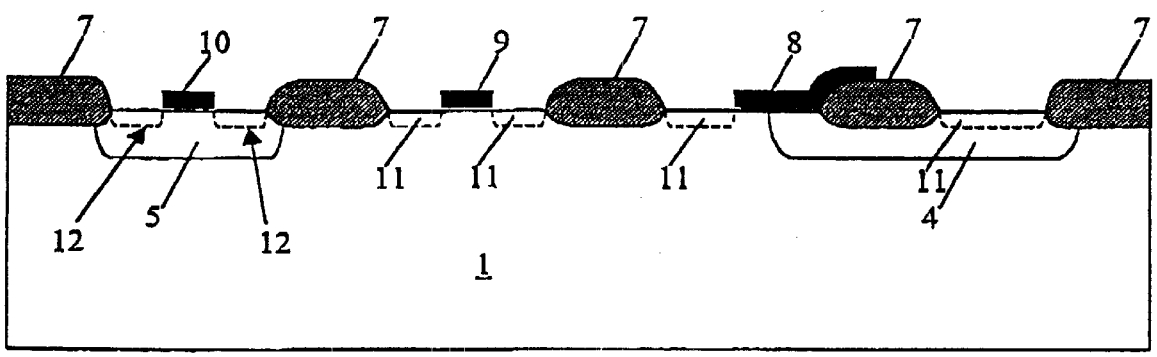

In the next step, illustrated in FIG. 9, p+-regions 12 are defined. These regions define the regions that correspond to drain and source for the low-voltage PMOS transistor to be produced.

Figure 10:
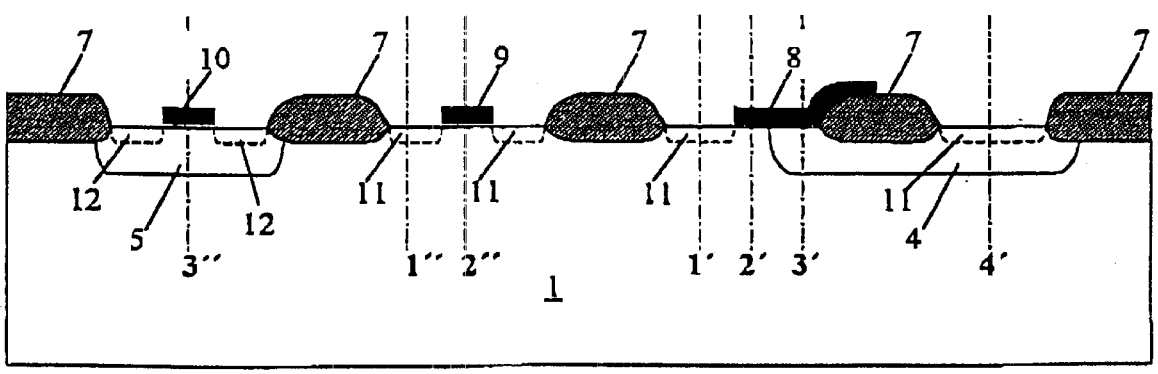

From FIG. 10, it is apparent that the cross-section of the high-voltage MOS transistor is the same as the cross-section of the low-voltage transistors. Thus, no extra masking step or any other process step is needed to produce the high-voltage MOS transistor in the normal CMOS process. The source region for the high-voltage MOS transistor is identical to the source region for the low-voltage NMOS transistor as apparent from cuts 1' and 1" in FIG. 10, The channel region for the high-voltage MOS transistor is identical to the channel region for the low-voltage NMOS transistor as apparent from cuts 2' and 2" in FIG. 10. The first portion of the voltage distributing region for the high-voltage MOS transistor is identical to the channel region for the low-voltage PMOS transistor as apparent from cuts 3' and 3", respectively, in FIG. 10. The remaining portion of the voltage distributing region is defined in that the gate, i.e. the poly-Si, extends on top of the thicker oxide and that the n-well is defined within the whole of this region. No part of this region has to be defined by means of extra process steps or extra masks but are fully defined by the process sequences and masks that already are present in the process flow. The drain region for the high-voltage MOS transistor (cut 4' in FIG. 10) is the same as the contact region (not illustrated in FIG. 10) to the n-well for the low-voltage PMOS transistor.

Figure 11:
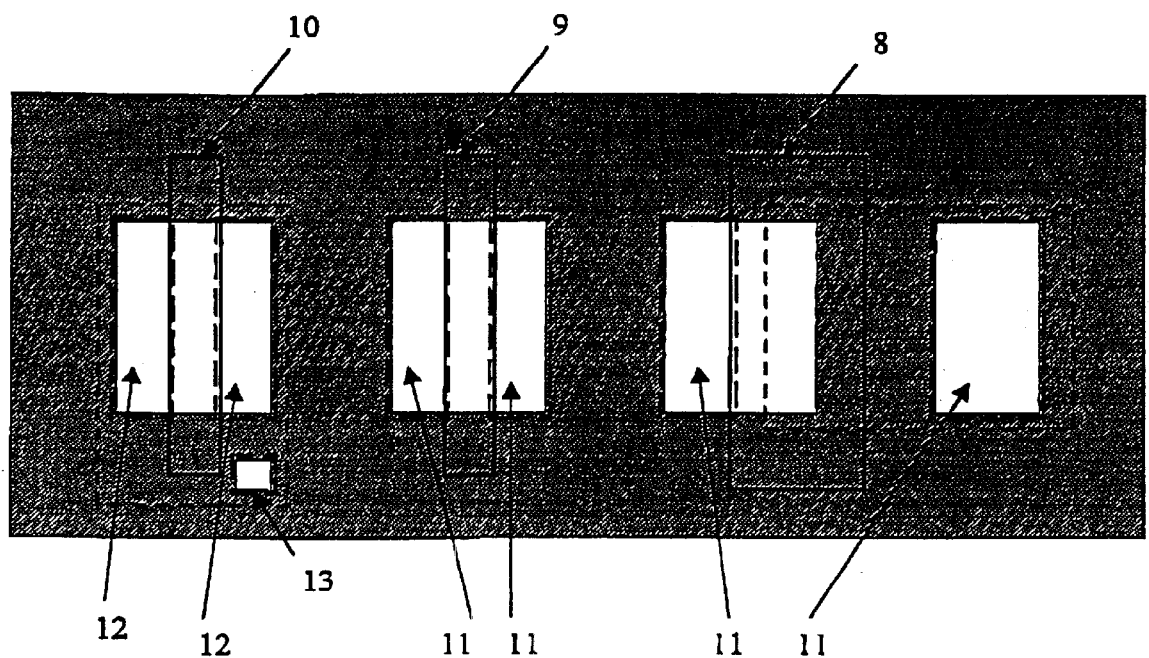
Figure 12:
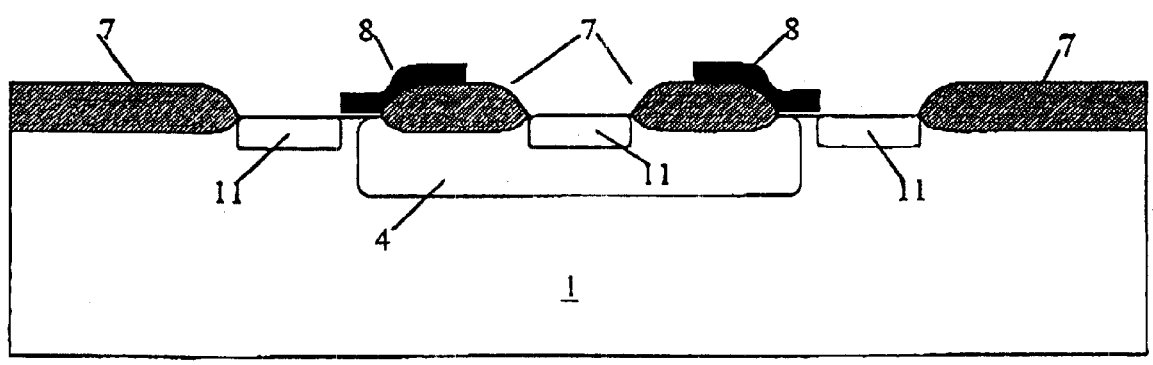

FIG. 11 illustrates how the layout looks from the top excluding succeeding steps such as moralization and passivation. The high-voltage MOS transistor is preferably done symmetrical i.e. so that it is mirrored in the middle of the drain region (at cut 4' in FIG. 10) so that all of the drain region is surrounded by the gate and source regions as illustrated in FIG. 12 which illustrate a cross-sectional view of a high-voltage MOS transistor that is symmetrical around the drain region in the middle.

What is claimed is:

1. An apparatus comprising:
   a high voltage MOS transistor on a substrate; and
   a low voltage NMOS transistor and a low voltage PMOS transistor, wherein the high voltage MOS transistor is produced on the substrate in the same CMOS process as the low voltage transistors, wherein the threshold voltage of the low voltage NMOS transistor and the high voltage MOS transistor are the same, and wherein the high voltage MOS transistor is symmetrical around a drain region of the high voltage MOS transistor.

2. The apparatus of claim 1, wherein the high voltage MOS transistor forms an analog line driver and the low voltage transistors form a portion of an analog-to-digital and digital-to-analog (AD/DA) converter.

3. The apparatus of claim 1, wherein the low voltage transistors and the high voltage MOS transistor have the same gate material and underlying gate oxide.

4. The apparatus of claim 1, wherein the high voltage MOS transistor and the low voltage transistors have similar frequency characteristics.

5. An apparatus comprising:
   an analog line driver including a high voltage MOS transistor; and
   an analog-to-digital and digital-to-analog (AD/DA) converter including a low voltage NMOS transistor and a low voltage PMOS transistor,
   wherein the high voltage MOS transistor and the low voltage transistors are formed on a same substrate in a same CMOS process, and wherein the high voltage MOS transistor is symmetrical around a drain region of the high voltage MOS transistor.

6. The apparatus of claim 5, wherein the low voltage transistors and the high voltage MOS transistor have the same gate material and underlying gate oxide.

7. The apparatus of claim 5, wherein the high voltage MOS transistor and the low voltage transistors have similar frequency characteristics.

* * * * *